US011799280B1

(12) United States Patent
Shultz et al.

(10) Patent No.: US 11,799,280 B1
(45) Date of Patent: Oct. 24, 2023

(54) AIRCRAFT GROUP POWER CABLE MANAGEMENT AND MONITORING SYSTEMS AND METHODS, INCLUDING HIGH CURRENT POWER SUPPLY ARC FAULT PROTECTION

(71) Applicant: Innovative Electrical Design, Inc., Plattsburgh, NY (US)

(72) Inventors: Preston D. Shultz, Woodstock, CT (US); Michael Marvin, Flanders, NJ (US)

(73) Assignee: Innovative Electrical Design, Inc., Plattsburgh, NY (US)

( * ) Notice: Subject to any disclaimer, the term of this patent is extended or adjusted under 35 U.S.C. 154(b) by 564 days.

(21) Appl. No.: 16/858,285

(22) Filed: Apr. 24, 2020

Related U.S. Application Data

(60) Provisional application No. 62/838,096, filed on Apr. 24, 2019.

(51) Int. Cl.
| | |
|---|---|
| *H02H 1/00* | (2006.01) |
| *H02H 7/22* | (2006.01) |
| *H01R 13/66* | (2006.01) |
| *H01R 11/01* | (2006.01) |
| *B64F 5/60* | (2017.01) |
| *G05B 19/042* | (2006.01) |
| *G01R 31/00* | (2006.01) |

(52) U.S. Cl.
CPC ............. *H02H 1/0092* (2013.01); *B64F 5/60* (2017.01); *G01R 31/008* (2013.01); *G05B 19/0428* (2013.01); *H01R 11/01* (2013.01); *H01R 13/6683* (2013.01); *H02H 1/0015* (2013.01); *H02H 7/226* (2013.01); *G05B 2219/24024* (2013.01); *G05B 2219/25359* (2013.01)

(58) Field of Classification Search
CPC .... H02H 1/0092; H02H 1/0015; H02H 7/226; B64F 1/362; B64F 5/60; G05B 19/0428; G05B 2219/24024; G05B 2219/25359; H01R 11/01; H01R 13/6683
USPC ........................................................ 361/62
See application file for complete search history.

(56) References Cited

U.S. PATENT DOCUMENTS

| | | | |
|---|---|---|---|
| 6,210,036 B1* | 4/2001 | Eberle ................ | H01R 13/6683 337/2 |
| 2004/0140673 A1* | 7/2004 | McCool ................... | B64F 1/36 290/1 R |
| 2010/0215358 A1* | 8/2010 | Harres ................ | G01R 31/1227 398/17 |
| 2013/0003233 A1* | 1/2013 | Panetta ................ | H02H 1/0015 361/42 |

(Continued)

OTHER PUBLICATIONS

A. Tulbure, "Type Test Procedure for Electronic Ground Power Units," 2006 IEEE International Conference on Automation, Quality and Testing, Robotics, 2006, pp. 176-179, doi: 10.1109/AQTR.2006.254626 (Year: 2006).*

*Primary Examiner* — Thienvu V Tran
*Assistant Examiner* — Sreeya Sreevatsa
(74) *Attorney, Agent, or Firm* — Downs Rachlin Martin PLLC

(57) ABSTRACT

Aircraft ground power cable management and monitoring systems and methods including arc fault protection. Disclosed systems are especially well-suited for high power systems such as 400 Hz aircraft ground power supply systems and cable assemblies.

16 Claims, 7 Drawing Sheets

(56) References Cited

U.S. PATENT DOCUMENTS

| | | | |
|---|---|---|---|
| 2015/0088438 A1* | 3/2015 | Kinsella | H02H 1/0007 702/58 |
| 2020/0174058 A1* | 6/2020 | Schmier, II | G01R 31/69 |

* cited by examiner

AIRCRAFT GROUP POWER CABLE MANAGEMENT AND MONITORING SYSTEMS AND METHODS, INCLUDING HIGH CURRENT POWER SUPPLY ARC FAULT PROTECTION

RELATED APPLICATION DATA

This application claims the benefit of priority of U.S. Provisional Patent Application Ser. No. 62/838,096, filed Apr. 24, 2019, and titled High Current Power Supply Arc Fault Protection, which is incorporated by reference herein in its entirety.

FIELD OF THE DISCLOSURE

The present disclosure generally relates to the field of power supplies. In particular, the present disclosure is directed to arc fault protection for power supply systems that operate at relatively high current ranges.

BACKGROUND

An arc fault is a high power discharge of electricity between two or more conductors. This discharge translates into heat, which can break down the wire's insulation and possibly trigger an electrical fire. These arc faults can range in power from a few amps up to thousands of amps high and are highly variable in terms of strength and duration. Common causes of arc faults include faulty connections due to corrosion and faulty initial installation.

All the world's aircraft are powered during maintenance, loading of passengers and offloading passengers by a flexible rubber plug that is either molded to the power cable or manually attached to the same cable. The industry has suffered from plug failures for 60 years. The failure rate and damage have increased in the last 20 years due to the introduction of changeable contact sections on the plug and the fact that these plugs have triple the needed force to stay attached to the aircraft. Consequently, forces have gone from 70 pounds to 200+pounds. The ability to keep new high force contacts on the plug allows the cable assembly to remain in service far beyond a safe service life. If the plug is poorly manufactured, then force can fail the plug much more quickly.

Plugs with a changeable contact section are longer and heavier than standard plugs. For example, a plug may weigh approximately 6.5 pounds and be approximately 9.5 inches in length. The changeable contact plugs may weigh approximately 15 pounds and be approximately 14 inches in length. This allows the changing of the contact every 45 days since the higher the force the faster the forces come down. To apply a plug to the aircraft receptacle at this level of force requires the person applying the plug to generate a force to push it on by whipping the plug in all directions while pushing or pulling at the same time. The forces that are used to mate and un-mate the plug are distributed to the fine wire highly flexible power cable and to the bonding joints that seal the molding material to the contacts and to conductor insulation and jacket.

Once the plug is destroyed by loosening the bonds and breaking the conductor's strands, the temperature rises in the plug and arcing can start inside the plug. In some cases, arcing happens in the plug at levels that cannot be detected by a circuit breaker because a circuit breaker may work on resistive loads and not be configured to detect an arc. The repeated arcing can carbonize the insulation inside the plug. The carbonization of the insulation allows the arcing to expand the range of the arc. The range continues to grow until either: from the broken molding bonds, water can reach the conductors; or broken bonds allow the arcing to reach a ground path or another conductor. The moment either happens, a circuit breaker cannot detect the fault so arc fault pulls all the current available in either a phase-to-phase or phase-to-ground fault which can send molten metal and burning rubber without tripping the breaker. At that point, the aircraft has suffered a catastrophic failure which has set the aircraft on fire, plated the copper to aircraft and cut a hole in the pressure structure of the aircraft.

SUMMARY OF DISCLOSURE

In one aspect of the present disclosure, an arc fault protection system for high current power supplies includes a current divider with a low current path and a high current path. A low current arc fault breaker is disposed in the low current path and configured to trigger a contactor relay to shut off system power when an arc fault condition is sensed. Multi-phase power supplies are protected with a current divider and low current arc fault breaker for each phase.

In one embodiment, an arc fault protection system for high current power supplies comprises at least one arc fault breaker with a current rating at a fraction of the total system current. A current divider is provided such that fractional current consistent with the arc fault breaker rating is passed through the breaker and the current balance is directed there around. When an arc fault is detected in the supplied cables, the arc fault breaker is tripped, cutting off current in the arc fault breaker connector. A current sensor on the arc fault breaker connector senses the current cut-off and delivers a control signal to a system controller in response thereto. The control system in turn generates a control signal to automatically cut off system power via a relay switch.

In one implementation, the present disclosure is directed to an aircraft ground power cable management and monitoring system that includes at least one aircraft ground power cable assembly having a unique cable assembly identifier, an aircraft connection end and a power supply connection end, plural insulated power conductors, at least one voltage sensor associated with each the power conductor disposed adjacent the aircraft connection end to sense output voltage in each the power conductor and a communication wire associated with each the voltage sensor and power conductor extending from its associated voltage sensor to the power supply connection end; at least one power supply with arc fault protection to which the at least one ground power cable assembly is connectable at the power supply connection end, a database configured to store the unique cable assembly identifier associated with date, location and operational information with respect to the at least one ground power cable assembly; and a processor and memory communicating with the at least one power supply, at least one ground power cable assembly and database, the memory containing instructions executable on the processor for installation of a new cable assembly and for ground power operation with an installed cable assembly, wherein the installation instructions comprise instructions for prompting for entry of the cable assembly unique identifier and gate number, prompting for confirmation of completion of cable assembly installation tests, and recording of entered data in the database; and wherein the installation instructions comprise instructions for prompting for entry of an aircraft to be powered identifier, monitoring of a number of power cycles applied to the cable assembly, monitoring of power levels applied and voltage drop through the cable assembly and recoding entered and monitored data in the database.

In another implementation, the present disclosure is directed to an aircraft ground power cable assembly that includes plural main flexible wire conductors, each having a plug end and an input end; a connector plug disposed at the plug end of the plural main flexible wire conductors, wherein each the main conductor terminates in a pin extending from the connector plug; plural output voltage sensors disposed in or adjacent to the connector plug, one the voltage sensor associated with each the main conductor; and a separate communication wire associated with each the main flexible wire conductor, each the separate communication line extending from one the output voltage sensor to the input end of the main flexible wire conductors.

In yet another implementation, the present disclosure is directed to a method of installing, monitoring and delivering ground power to an aircraft with a ground power cable assembly. The method includes connecting a ground power cable assembly to a power supply communicating with a control processor and database; recording a unique cable identifier associated with the installed cable assembly in the database; prompting the user through a user interface communicating with the control processor to enter a gate number for the installed ground power cable assembly and recording the gate number in the database; prompting the user through the user interface to confirm completion of at least one installation test and recording installation test data in the database; prompting the user through the graphical user interface to initiate a ground power operation for an aircraft through the installed cable; prompting the user to enter the aircraft identification number; recording a number of usage cycles for the installed aircraft ground power cable in the database; monitoring voltage drop through the ground power cable assembly and power delivered and recording voltage drop and power delivered in the database; and automatedly prompting the user or terminating ground power delivery when an alert condition is detected by the control processor based on monitored parameters.

In still another implementation, the present disclosure is directed to a high current, multi-phase arc fault protection system that includes multiple phase lines corresponding in number to the number of phases; a current divider disposed in each phase line configured to divide input current into a larger current fraction and a smaller current fraction through electrically parallel current paths; an arc fault protection breaker disposed in each the smaller fraction current path, the arc fault protection breakers having a current capacity less than the input current and greater than the smaller current fraction; a voltage sensor in each the smaller fraction current path; a multi-phase relay switch connected across each the phase line; and a relay switch actuator communicating with each the voltage sensor, the relay switch actuator configured to actuate the multi-phase relay switch to disconnect each the phase line simultaneously upon receiving a signal from one the voltage sensor indicating a voltage break in one the smaller faction current path.

BRIEF DESCRIPTION OF THE DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

Aspects of the present disclosure include devices and methods of aircraft ground power cable management and for arc fault protection and power supply systems with intelligent arc fault protection that are configured to detect identifying information associated with an electrical plug connected to the power supply, and verify the identifying information in association with an authorized plug before providing power to the plug. Aspects of the present disclosure also include a plurality of power supplies connected over a network and configured for communication with other components on the network and for remote monitoring and configuration.

Figure 1:
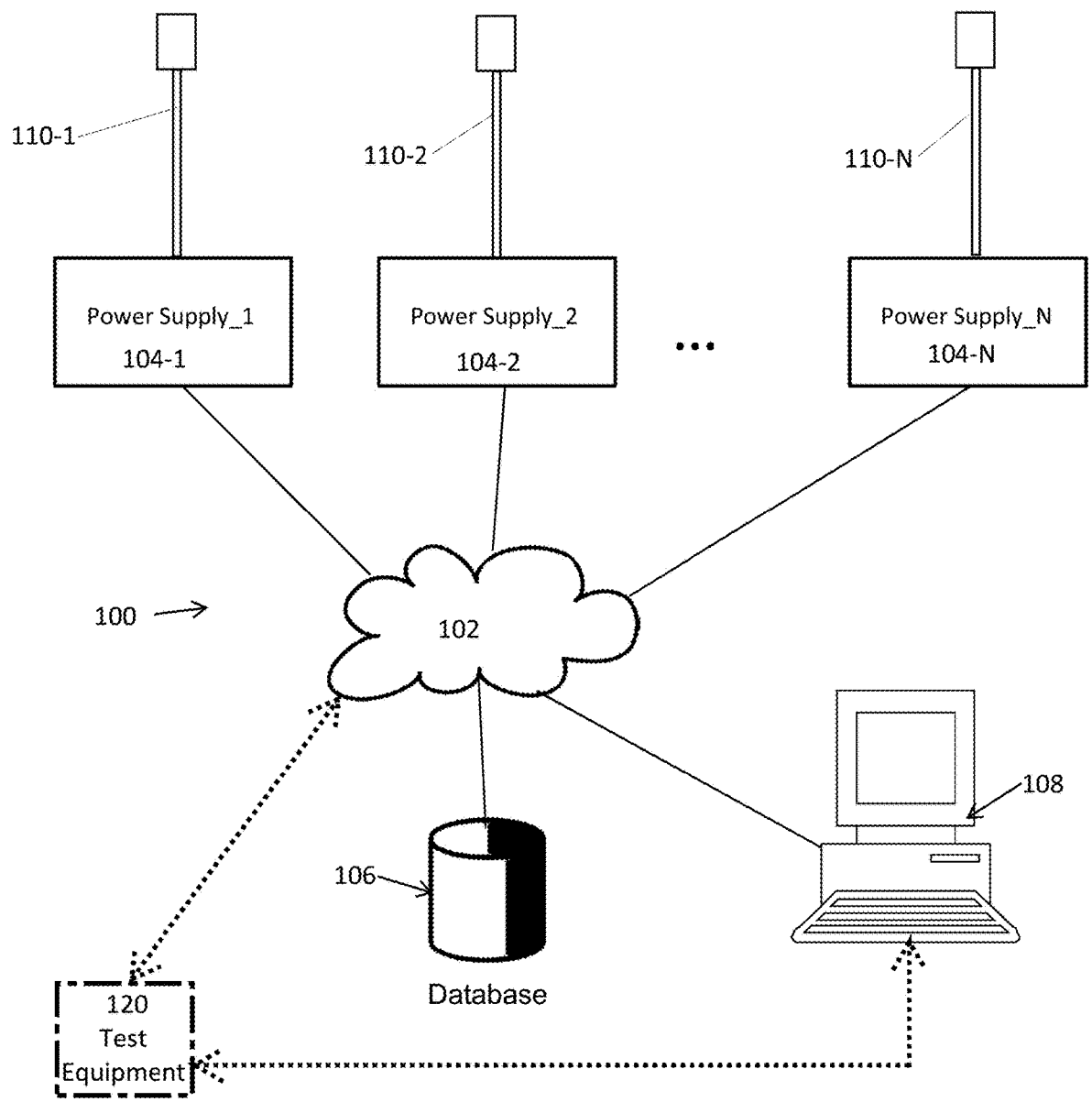
FIG. 1 is a schematic diagram of an embodiment of a CAMS system as disclosed herein.

An embodiment of a cable awareness and management system (CAMS) 100 is schematically depicted in FIG. 1. CAMS embodiments in accordance with the present disclosure will include a network 102, such as a local area network, or internet-based network, providing communication between one or more power supplies 104-1, 104-2, . . . 104-N and database 106 with computer or processor control 108, which may include memory and a user interface (GUI) as described in greater detail below in connection with FIG. 6. Each power supply 104-1, 104-2, . . . 104-N is connected to a ground power cable assembly 110-1, 110-2, . . . 110-N. Power supplies communicate with one or more generators or other sources of aircraft ground power (not shown), for example three-phase, 400 Hz, 300A power, and may comprise gate boxes, point-of-use power converters or other mobile powers supply systems as used at particular airports or other installations. It is to be appreciated that the ground power cable assemblies are not dedicated to specific power supplies. In practice, the ground power cable assemblies may be switched and reattached to different power supplies in the normal course of use and maintenance of the aircraft ground power systems. In part, because the ground power cable assemblies may be removed, reattached and switched between power supplies, CAMS embodiments disclosed herein are configured to detect and record information identifying the specific ground power cable assembly and information regarding its use and time of use. For example, CAMS 100 may be configured to record the installation of a specific ground power cable assembly by a unique cable ID and record the gate, date and time of installation. CAMS 100 may also record the applications of the cable to the aircraft, record the application of power or lack of application, and record the removal of power.

Figure 3B:
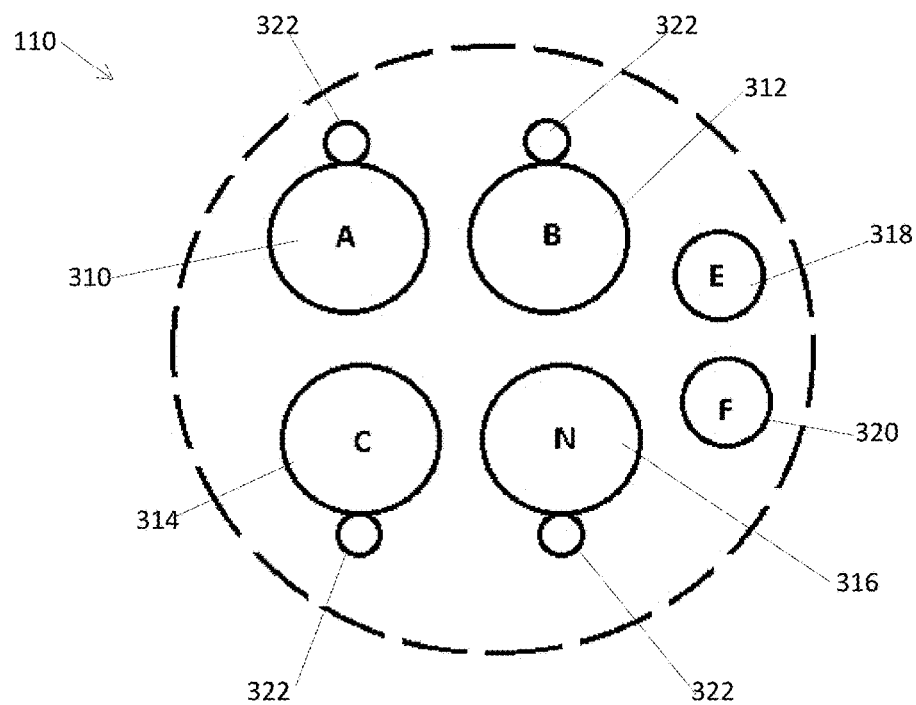
FIGS. 3A and 3B are schematic details of embodiments of cable assemblies according to the present disclosure.
Figure 3A:
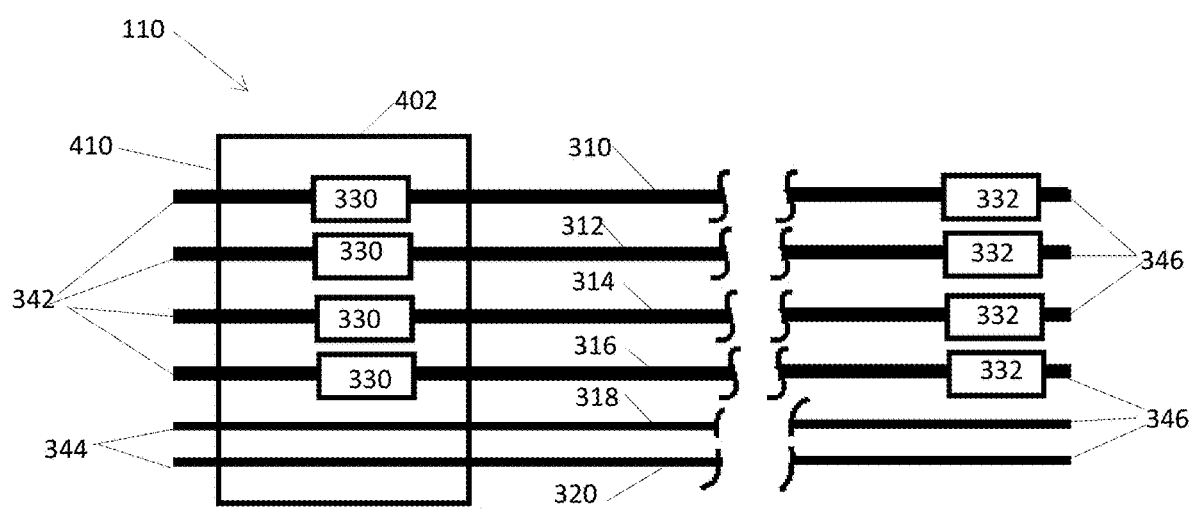

When power is supplied to an aircraft through CAMS 100 from one of power supplies 104-1, 104-2 . . . 104-N and its connected ground power cable assembly 110-1, 110-2 . . . 110-N, as further described below, the CAMS 100 senses changes in voltage and frequency that would be indicating conductor breakage leading to an arc fault condition. CAMS 100 can be configured to compare voltage into the cable assemblies with voltage at the plug end into the aircraft by using integrated voltage sensors as shown in FIGS. 3A-B, and discussed further below. The system will also watch for continuity of the neutral conduct in all cables but focused on the neutral in the 6@1 cable. The system will be given the voltage drop for all cables that will be used by the system through the selection of the cable type and length when the cable is first installed on the system. The system will keep record of the voltage to the aircraft from the plug and voltage to the cable, and it will also record the current by phase for each aircraft that is at the gate.

In one example, CAMS system database 106 comprises a database of plug IDs that may be and each of the power supplies that may be configured to initiate a communication with the database 106 each time a new power connection is initiated to determine if the plug ID associated with a given plug is authorized. In other examples, the database may also be replicated on the local memories of each power supply 104-1, 104-2, . . . 104-N for direct access and writing by the corresponding respective processors 422 in each power supply (see FIG. 2). In one example, the power supplies 104-1, 104-2, . . . 104-N may be configured to transmit the plug ID information associated with the plug connected to a specific power supply when an arc fault is detected to the other components of CAMS 100, such as each of the plurality of other power supplies 104-1, 104-2, . . . 104-N, the database 106, and computer control 108, to update the status of the plug ID from authorized to not-authorized such that the plug can no longer be used to connect to any of the power supplies. The at least one computer may be used for updating the database, controlling one or more of the power supplies, and monitoring the status of the power supplies. Test equipment 120 for testing parameters such as plug force, phase rotation and load bank testing, may also optionally be integrated into system 100 and communicate with wireless or wired communication through network 102, or directly with computer control 108.

Figure 2:
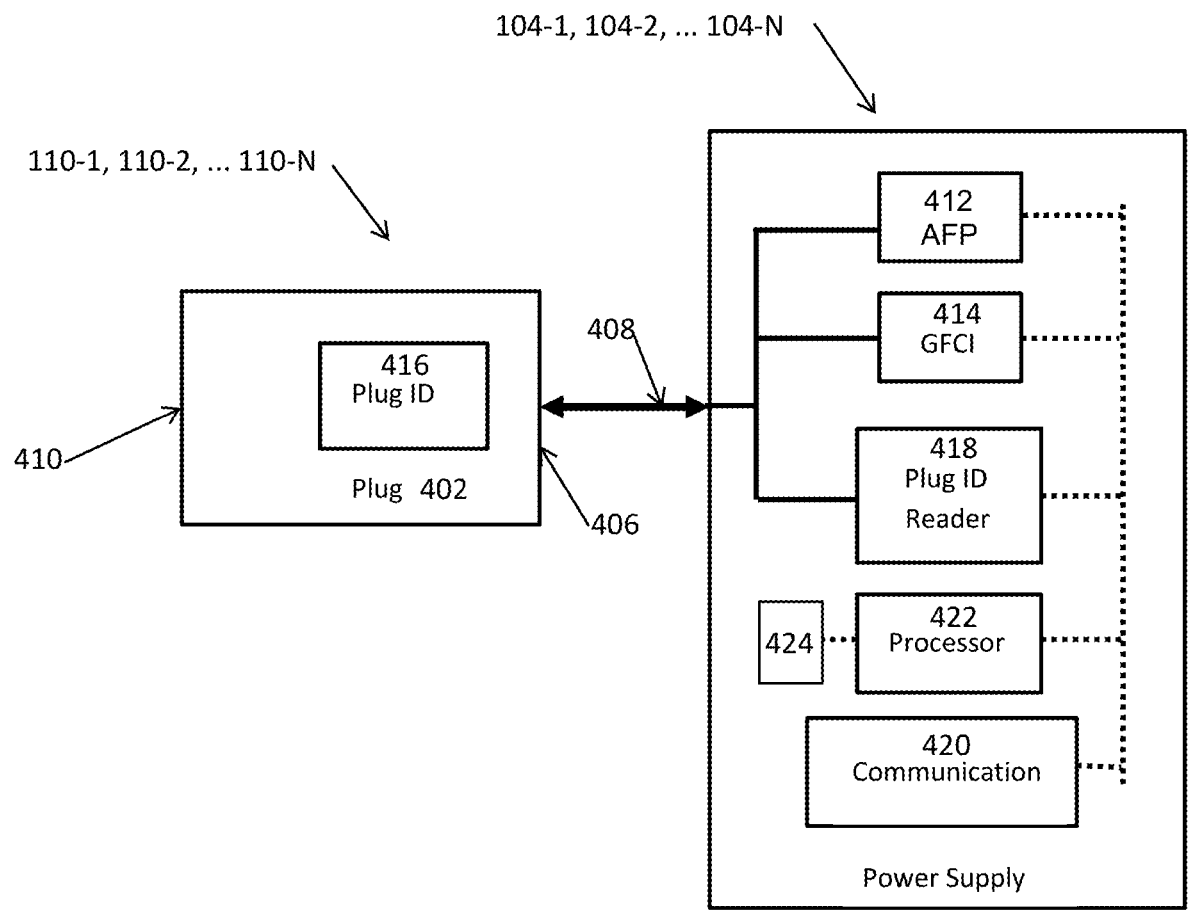
FIG. 2 is a block diagram of a power supply and cable assembly according to embodiments disclosed herein.

FIG. 2 shows an example of an embodiment of one of power supplies 104-1, 104-2, . . . 104-N and connected cable assemblies 110-1, 110-2, . . . 110-N, as in FIG. 1. Power supply embodiments illustrated in FIG. 2 employ arc fault protection module (AFP) 412 for high current intelligent arc fault protection. In one example, as discussed above, the power supply is configured to provide three-phase alternating current at approximately 115 to 200 V, approximately 400 Hz, and up to approximately 250-300 A, and in some cases, approximately 260 A, for powering an aircraft while the aircraft is on the ground. The power supply may be configured for either a wye (Y) or delta (Δ) circuit. In the case of a wye circuit, three wires may carry the three phases and a fourth wire may be used as a neutral or return. In other examples, power supplies made in accordance with the present disclosure may be configured to provide power to other types of devices at other voltages and frequencies.

Cable assemblies 110-1, 110-2, . . . 110-N include plug 402, which may include a first connecting end 406 for connecting to the power supply via cable 408 and a second connecting end 410 for connecting to an aircraft to provide three-phase alternating current power to the aircraft. In the illustrated example, the power supply includes arc fault protection module (AFP) 412 and a ground fault circuit interrupter (GFCI) 414. The AFP 412 and GFCI 414 can have any of a variety of configurations as discussed further below. GFCI 414 for detecting ground faults may be integrated with AFP 412, or provided as a separate module.

As discussed above, embodiments of power supplies 104-1, 104-2, . . . 104-N, and in particular, embodiments shown in FIG. 2, may also be configured to detect an identifier associated with the plug when it is connected to the power supply via cable 408 and determine whether the plug 402 is associated with a prior ground or arc fault. The power supply can also be configured to record particular plug identification information when a ground or arc fault has been detected so that the plug cannot be used in the future. The power supply may also be configured to shut down and not provide power again until a new plug is detected. In the illustrated example, the plug includes a plug ID feature 416. The plug ID feature 416 can be any of a variety of configurations known in the art for storing and transmitting plug identifying information (plug ID) to the power supply. For example, the plug ID feature 416 can be one or more of a barcode, matrix barcode (such as a QR code @), passive or active radio frequency identification (RFID) tag, and/or a near field communication (NFC) chip. The power supply may have a corresponding plug ID reader 418, such as a barcode scanner, RFID reader, or NFC chip reader for detecting when the plug 402 is connected to the power supply 104 and reading the plug ID.

Embodiments of power supplies 104-1, 104-2, . . . 104-N may also include a communications module 420 for wired and/or wireless communication with other devices using any of a variety of wired or wireless communication protocols such as Ethernet, Wi-Fi, Bluetooth, ZigBee, etc., known in the art. For example, communications module 420 may include one or more of a LAN card, and/or a wireless communication transceiver for wirelessly sending and receiving information. The power supply 104 may include at least one processor 422 for controlling the plug ID reader 418 and communications module 420. In one example, the processor 422 may be configured to encrypt and decrypt messages transmitted and received by the communications module, and may also be configured to control the plug ID reader 418 to detect the presence of the plug 402, read the plug ID 416, and compare the plug ID 416 to a database of plug IDs (106 in FIG. 1). In one example, the power supply will only begin to provide power after the plug ID 416 has been determined to be an authorized plug ID. The one or more processors 422 may also be configured to control or monitor the status of AFP 412 and GFCI 414 and change the status of the plug ID in the database 106 from authorized to not-authorized if one or more of an arc fault or a ground fault is detected. In one example, the power supply 104 includes at least one memory 424 configured to store a database or other file structure of plug IDs which can be checked by the processor prior to providing power to a plug and also updated, for example, following a fault detection.

As mentioned above, ground power cable assemblies 110-1, 110-2, . . . 110-N use voltage sensors to detect voltage drop through the conductors. In embodiments illustrated in FIGS. 3A and 3B, each cable assembly 110 comprises plug 402 as above with "A,B,C and N" main conductors 310, 312, 314, 316, respectively, as well as secondary, E and F conductors, 318 and 320 respectively, for interlock circuit for power activation. Cable assemblies 110 will also have smaller wires 322 (or other communication signal path such as fiber optic with "wire" used herein as a generic term for any suitable communication pathway) that run along the main conductors and are tied to the main power conductors provided for communication of voltage measurements by voltage sensors 330 and 332, in particular voltage sensors 330 on the aircraft end of the cable, which may, in one example, be embedded in a molded body of plug 402. Any suitable form of voltage sensor including voltage sensor coils may be utilized as voltage sensors 330, 332. Note that when two voltage sensors per main conductor are utilized as shown in FIG. 3A, then it may be desirable to include a second communication wire for each main conductor so as to permit separate interrogation of the two voltage sensors on each main conductor. Conductor pins 342 and 344 are provided at aircraft end 410 of plug 402 into which conductors 310, 312, 314, 316, 318, and 320 terminate. At the opposite power supply end, appropriate connectors 346 are provided for connection to the power supply. Each of the main conductors and secondary conductors are encased in appropriate flexible insulating material. Portions of the conductors thus insulated may be further encapsulated in a further flexible insulating material as indicated in the surrounding dashed circle in FIG. 3B. However, to provide greater flexibility, it may be preferable to only band together the individually insulated conductors at periodic locations over the entire length. Communication wires may be embedded in the main conductor insulation or provided as small separately insulated wires captured by the periodic bands in the same bundle.

Figure 4:
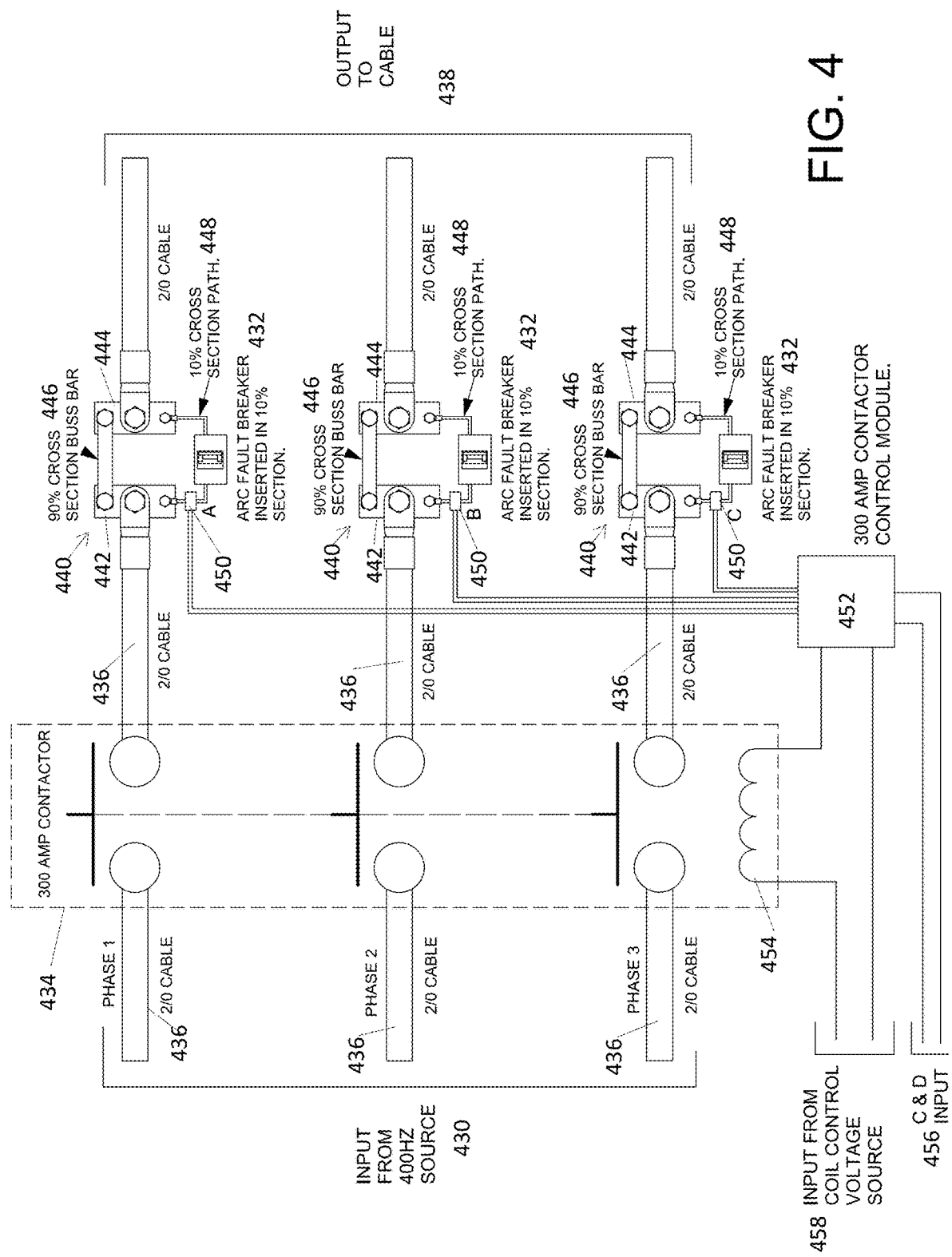
FIG. 4 is a schematic diagram of an embodiment of an arc fault protection system as disclosed herein.

One example of an embodiment of AFP 412 configured as a high frequency/voltage/current arc fault protection system is schematically depicted in FIG. 4. Power supplied to the system on the input side 430 may be three-phase alternating current at approximately 115 to 200 V, approximately 400 Hz, in the range of approximately 250-300 A. Nominal current of approximately 260 A is typical for commercial and military aircraft ground power supplies. In spite of the high current applied through the system, complete arc fault protection may be provided using, for example, three conventional 30 A arc fault breakers 432 and other "off-the-shelf" components when combined and configured according to the teachings of the present disclosure. It is thus an advantage of certain embodiments disclosed herein that no specially designed components are needed for the disclosed system. While the present embodiment is exemplified in the context of 400 Hz ground power operating in a current range of 250-300 A, as will be appreciated by those skilled in the art, the teachings disclosed herein may be employed with power systems operating at different frequencies, current and voltage.

As shown in FIG. 4, three-phase power is provided into a 300A contactor or relay switch 434. Separate, appropriately-sized cables 436 are provided for input and the output to the relay. In the case of 400 Hz power, 2/0 cables are typical. Other cable sizes may be employed as appropriate for the power supplied. On the output side 438, each cable for each phase is connected to a current divider 440 incorporating a conventional, lower amperage arc fault breaker 432. Each current divider 440 comprises input and output terminals 442, 444, respectively, which are connected by and electrically communicated through appropriately-sized connectors 446, 448 configured to provide the desired current division. With large current devices, typically the greater fraction of current will be routed through a straight through connector and a smaller fraction of the current, the amount selected to match a lower amperage rated arc fault breaker, routed through the arc fault breaker connector. In general the larger current fraction will be greater than 50% of the total current and the smaller current fraction will be less than 50% with the total of the two equaling 100%. In the example illustrated in FIG. 4, with an input current in the range of 250-300 A, in order to employ a 30 A arc fault breaker, the current division provided is 90% straight through and 10% through the arc fault breaker. One means for achieving current division as shown in FIG. 4 is to provide first and second connectors of the same conductive material together having total cross section, wherein the straight-through connector 446 provides 90% of the total connector cross-section and the arc fault connector 448 provides 10% of the total cross-section of connector material. In this manner 10% of the total current at the current divider 440 input terminal passes through the arc fault breaker. Copper wire or copper bus bars are examples of suitable connector materials. Persons skilled in the art may select other materials for specific applications, and also may employ other current division ratios without departing from the teachings of the present disclosure. With the arrangement as thus described, 10% of the current, in other words 25-30 A in the big example embodiment passes through each arc fault breaker for each phase.

As also shown in FIG. 4, on the input side to each arc fault breaker 432 a current sensor 450 is disposed on the connector. In one implementation, each current sensor 450 detects the presence or absence of current in its associated arc fault connector and provides input to a system controller 452 indicative of the sensed parameter. Controller 452 may be configured as module operating within processor 422 (FIG. 2) or may be configured in a separate processor. If an arc fault is detected in any cable by the corresponding art fault breaker 432, the arc fault breaker is tripped and current through connector 448 is cut off. When the current sensor 450 for that connector path senses the absence of current, a signal is sent to the system controller 452. The system controller 452 in turn controls the coil 454 that operates the 300 amp contactor/relay switch 434. Thus when an arc fault is detected in any phase by the low amperage arc fault breaker 432, complete system power in all phases is automatically shut off to avoid potential catastrophic damage to equipment supplied by the system. As also shown in FIG. 4, separate input voltage 456 is provided to the system control module 452 and another input voltage 458 is provided to power the relay coil 454. The system control module 452 may optionally include additional sensing and communications features as described above in connection with alternative embodiments shown, for example, in FIGS. 1 and 2.

In an alternative embodiment, AFP system 412 may be configured as an arc fault circuit interrupter (AFCI), which may contain electronic components to monitor power being transmitted through the cable assemblies 110 based on sensed voltages, for example by or including voltage sensors 330 and 332 and communication through conductors 322 as described above, for the presence of dangerous arcing conditions, which components may be configured and/or programmed by persons of ordinary skill in the art based on the teachings contained herein. In some embodiments AFP 412 may take the form of a commercially available AFCI.

Figure 7A:
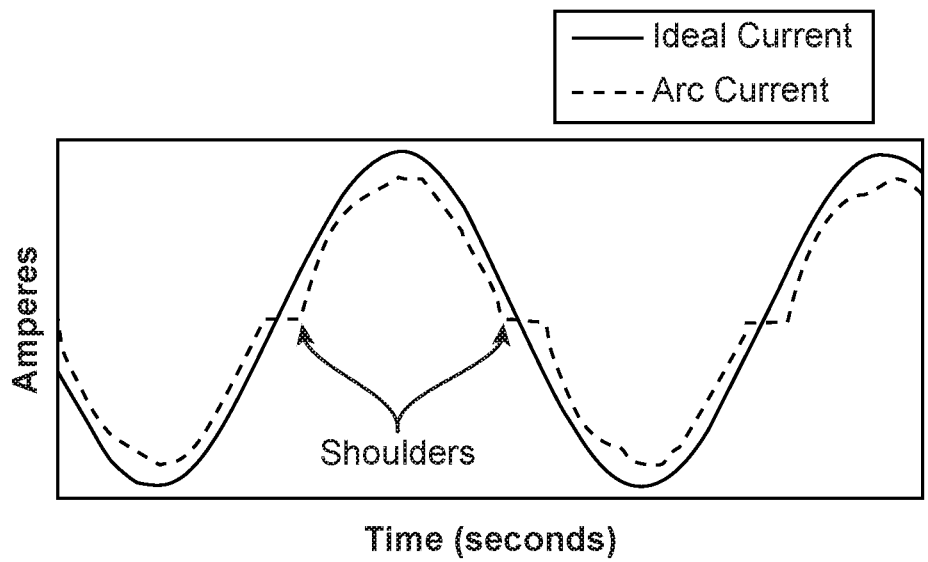
FIGS. 7A and 7B are an example plot of an ideal and arc current and an example plot of an arc current and voltage, respectively.
Figure 7B:
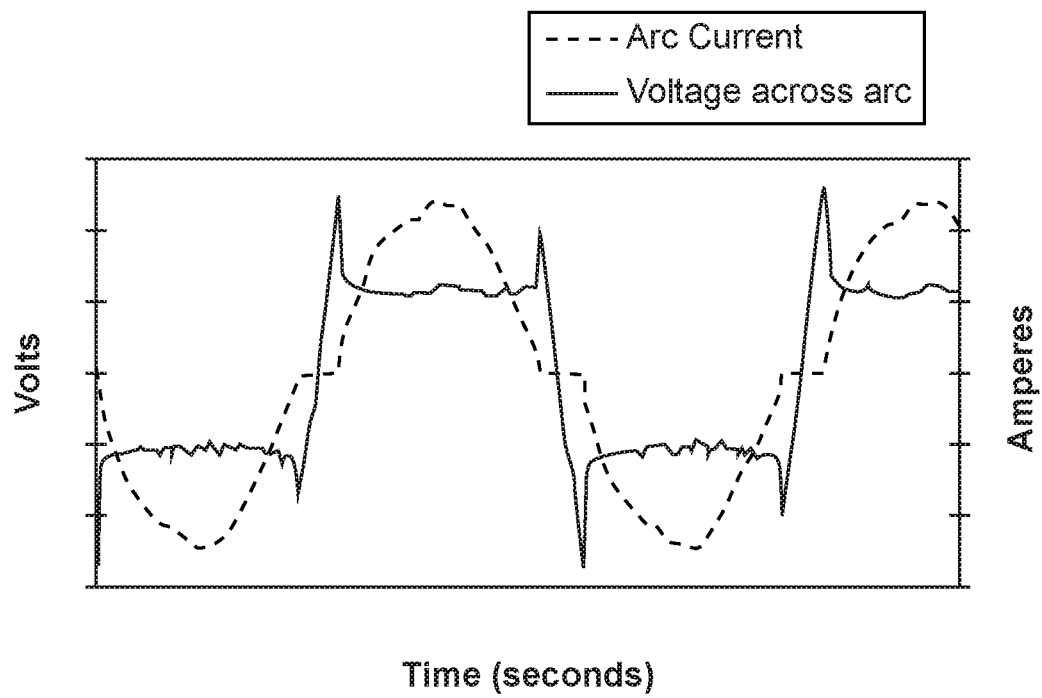

In another embodiment, an AFCI (as AFP 412) according to the present disclosure may be configured to monitor one or more of current, voltage, and power, etc. associated with each of the three phases of alternating current being provided to the cable assemblies 110 for detecting an arc fault. FIG. 7A shows a simplified example of an ideal single-phase current and an arc current and FIG. 7B shows single-phase voltage and current in an arcing circuit. As shown, an arcing circuit can have particular characteristics such as flat "shoulders" in the current around current zero; a lower than ideal current; voltage across the arc approaching a square wave; voltage spikes each half cycle as the arc ignites and extinguishes; and high frequency "noise" in the current. Thus, in one example, an AFCI according to the present disclosure may be configured as a current monitor to detect flat spots in one or more of the phases of sinusoidal current being transmitted through the plug, such as the example "shoulders" shown in FIG. 7A, and/or may be configured to detect abnormal steps in voltage as shown in FIG. 7A, among other techniques. In such embodiments, the AFCI (as a form of AFP 412) may be configured to detect an arc between line and neutral, a series arc, (such as in a broken or frayed wire or at a loose connection), and/or an arc between line and ground. In one example, the AFCI can be configured for approximately 250-300 A, and in some cases approximately 260 A arc fault protection.

Figure 5:
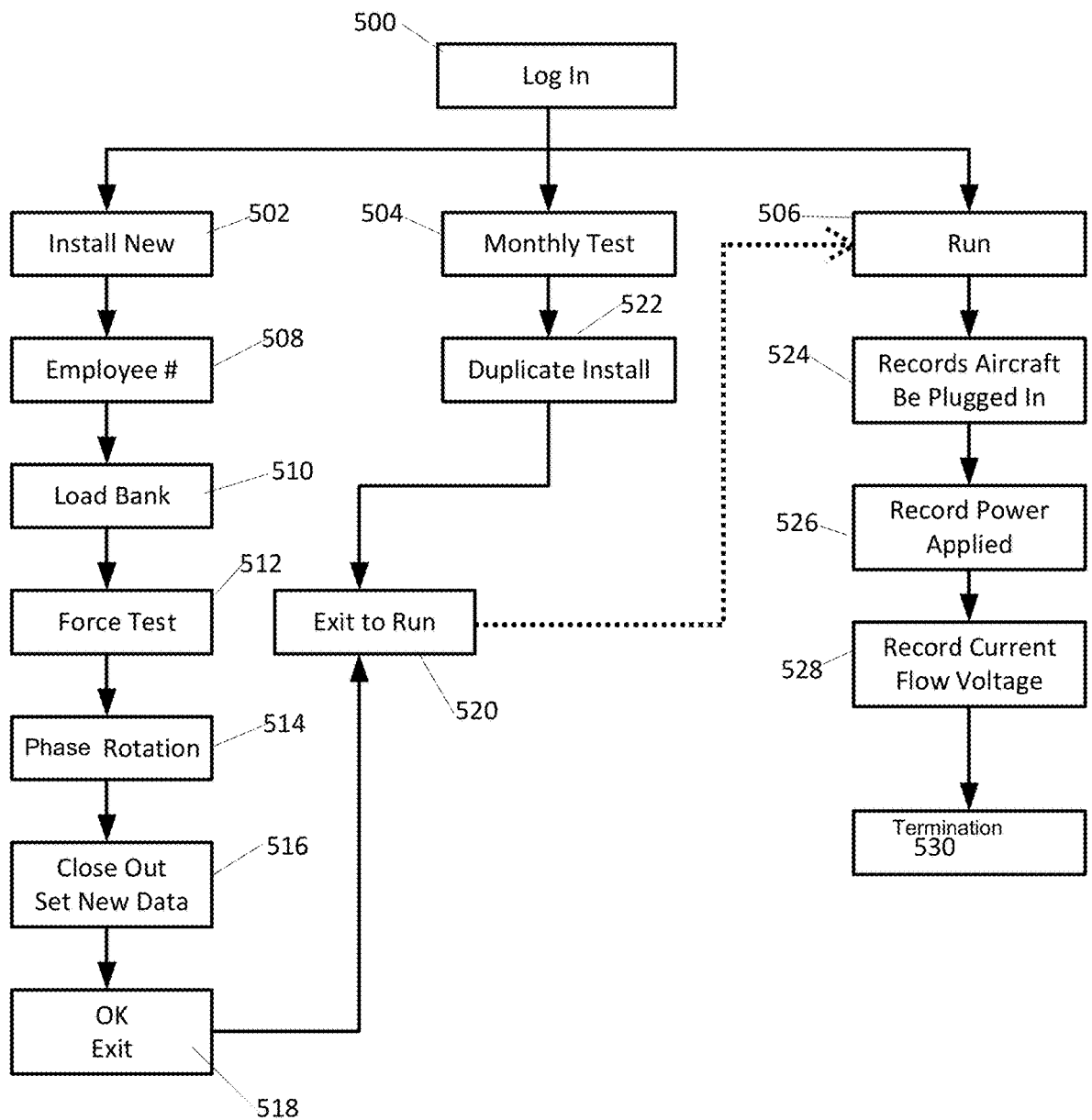
FIG. 5 is a flow diagram illustrating an embodiment of a method of cable management and monitoring according to the present disclosure.

Using systems as described herein, automated or semi-automated cable management, monitoring and replacement/repair protocols may be readily implemented using processors 422 in each power supply 104 and/or system computer/processor 108. FIG. 5 illustrates an example of a process control for one such embodiment. After login, preferably using an appropriate secure login protocol, the user is presented with three options through a graphical user interface (GUI): Install New 502 a new cable assembly, Monthly Test 504 for a previously installed cable assembly, and Run 506 for initiating aircraft ground power operations.

When the user selects Install New 502, they are prompted through an initiation protocol beginning at step 502 automated prompts for entry of date, time and cable type information. In one embodiment, such information may be prompted in a GUI display as follows:

| Enter Date: | Enter Time: |
|---|---|
| Enter Gate: | Enter Power Supply ID: |
| Enter Cable Assembly Serial Number: | |
| Select Cable Type | Select Cable Length |
| Banded 1/0 | 60' |
| Banded 2/0 | 80' |
| 6@1 | 100' |
| 3/3 | |

It will be appreciated by persons of ordinary skill that one or more of the fields above may be considered optional or unnecessary in some applications. The type of cables may be stored in database 106 accessible by controller 108 (or 422), which will correspond to the conductor types in the cable so that the proper voltage drop calculations can be performed. Alternatively, rather than providing drop down menus with selectable parameters, windows for text entry of prompted for information may be presented. Either before or after installation data as above is prompted for, a prompt is provided to entire user identification, such as Employee ID at step 508. Installation tests are prompted for in steps 510, 512, and 514, which may be presented in any order. The system may be configured such that each test must be confirmed by the user before advancing to the next process step. Confirmation may require the user to enter key indicators of successful test completion, such as confirmed values or completion codes from test equipment. In an alternative embodiment, one or more of the test equipment 120 (FIG. 1) may communicate directly with the system through network 102 or directly with computer control 108 via wired or wireless communications to provide direct confirmation. In such cases, the system process may simply indicate when a test is completed and prompt for the next test without the need for the user to enter results manually.

Load Bank 510 requires confirmation of load bank test results. The current and voltage drop readings during normal operation may be erratic at times. Because of this, the process may include a Load Bank test mode 510 where the system can be connected to a load bank and when activated, will record the date and time of the test as well as the peak current on each phase conductor, and neutral during the test and the voltage drop across each conductor.

Force Test 512 requires confirmation of a plug force test, which may be performed with a plug force test system such as described in Applicant's co-pending International Patent Publication WO 2019/217896 A1, entitled "Aircraft Ground Power Plug Force Tester," which is incorporated by reference herein in its entirety. A plug force testing system such as described in the foregoing patent publication may be incorporated into the overall system such that plug force measurements are automatically transmitted to system processor 108. The plug insertion force test is saved in a file which is dated, and time stamped. The date and time stamp can be compared to the date and time on the system.

Phase Rotation 514 requires confirmation of a phase rotation or phase sequence test in which the sequence of the phases is determined using a phase sequence tester attached to the plug pins 342 (FIG. 3A). Close Out prompt 516 asks the user if there is an additional new cable to be installed and returns process flow to Install New 502 if answered affirmatively. Upon Exit 518 from the install process, the user is prompted to Exit to Run at 520. This is selected when it is intended to immediately use the newly installed cable assembly for ground power supply.

System protocols will dictate a periodic required testing time. In some cases the period for testing may be every 30 days. Upon login, Monthly Test 504 may be a user-selectable option. Alternatively, or additionally, Monthly Test 504 may be automatically prompted when Run 506 is selected if the cable assembly detected is determined to be at or exceed the period testing time. Duplicate Install 522 prompts for testing of a second cable assembly when a gate box includes more than one. In a further alternative, system alerts regarding tests due may be automatically sent to maintenance personnel by email or text messages or other suitable messaging application.

When system Run 506 is initiated to provide ground power to an aircraft, the system will first record the aircraft to be powered (for example, by prompting entry of aircraft tail number).

By monitoring and recording Applied Power 526 and Current Flow 528, the system allows for the real-time monitoring of the condition of ground power cables located at the airport gate. As described above, voltage sensors placed at the input and output sides of the cable provide signals from the gate side as well as the aircraft side of each of the main conductors in the cable. The signal values may be compared to each other by processor 108 to determine the condition of the main conductors in the cable. The compare values are determined by the voltage drop across the main conductors in the type of cable being used. Measured values and compare values also may be stored in database 106 for future maintenance reference and system calculations. Also, the system may keep a running total of the number of use cycles of the identified power cable assembly in order to provide a max cycle warning. Max cycles may be user selectable or preset in the system. A common preset max cycle number is 5000 cycles indicating when the cable should get a more detailed inspection at the max cycle threshold to determine if still safe to beyond that number of cycles.

Each type of cable will typically have a different operating voltage drop characteristic due to the gage of the main conductors making up the cable. Based on cable assembly ID, and information stored in database 106, the system may know the voltage drop characteristics for a specific cable in operation. During normal operation, the controller will record the number of activations for each cable as well as the date and time of each activation. The system will also record the current of each phase and neutral as well as the voltage drop across each main conductor while in operation.

Upon termination of a ground power operation 530, all collected information may be stored in database 106. The recorded data may include: records of aircraft or bridge movements, records of date and time of cable installation and cable use, records of power drop, records of power restoration, records of power converter on and off.

Any one or more of the aspects and embodiments described herein may be conveniently implemented using one or more processor-controlled or processor-based machines programmed according to the teachings of the present disclosure. Aspects and implementations discussed above employing software and/or software modules may also include appropriate hardware for assisting in the implementation of the machine executable instructions of the software and/or software module as described hereinbelow.

In one example, such software may be a computer program product that employs a machine-readable storage medium. A machine-readable storage medium may be any medium that is capable of storing and/or encoding a sequence of instructions for execution by a processor-controlled or processor-based machine and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory in any tangible or non-transitory form. As used herein, a machine-readable storage medium does not include, and expressly excludes, transitory forms of signal transmission.

Figure 6:
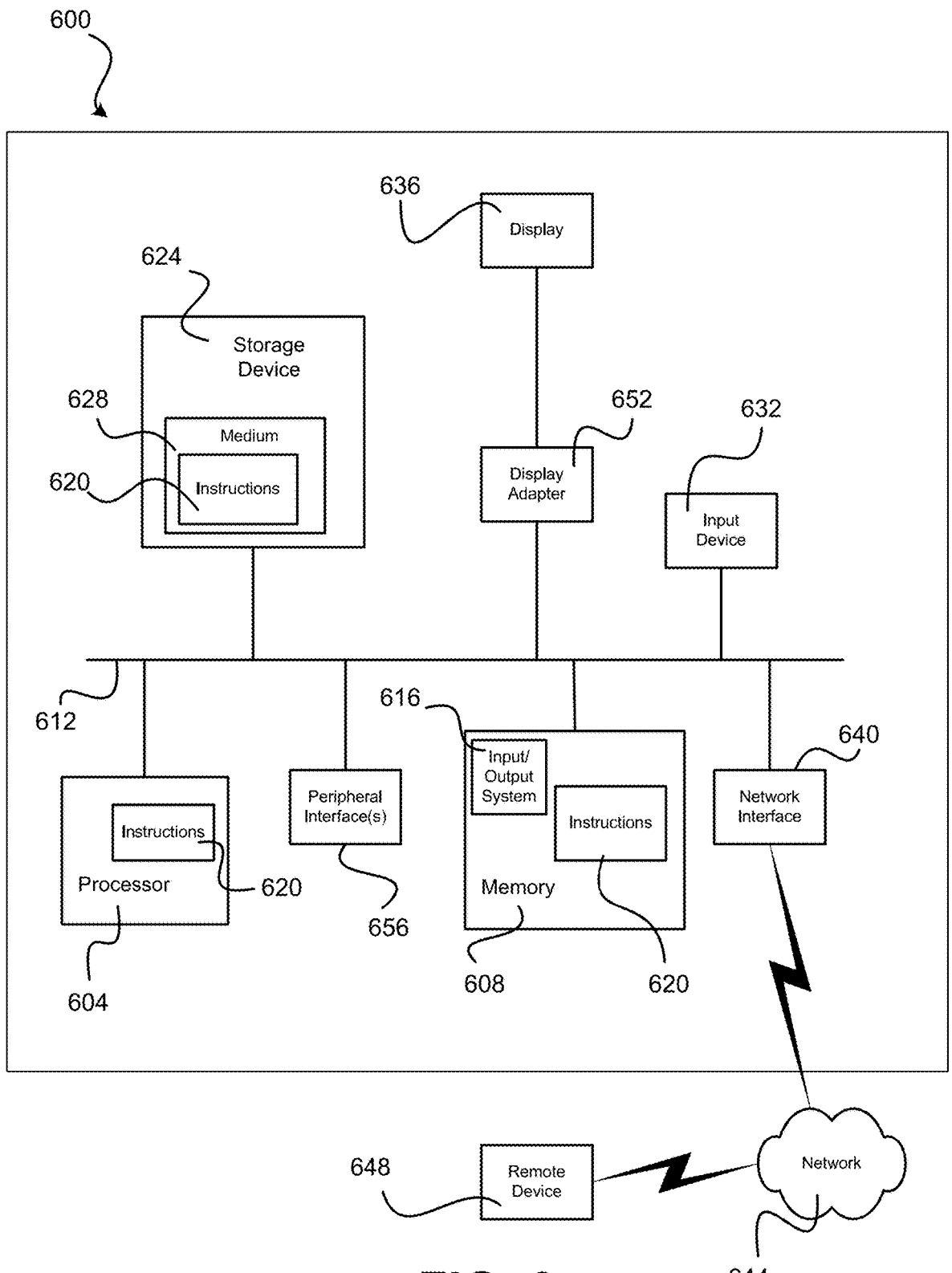
FIG. 6 shows a diagrammatic representation of one example of a computer-based implementation of embodiments disclosed herein.

Examples of a processor-controlled or processor-based machines include any device or machine incorporating or responsive to a processor that is capable of executing a sequence of instructions that specify an action to be taken by that machine or device. FIG. 6 shows a diagrammatic representation of one embodiment of a processor-controlled or processor based machine in the exemplary form of a system 600 within which a set of instructions for causing a control system, such as the control system of FIG. 1 or the power supply system of FIG. 4, to perform any one or more of the aspects and/or methodologies of the present disclosure may be executed. It is also contemplated that multiple processor-controlled or processor-based machines may be utilized to implement a specially configured set of instructions for causing one or more of the devices to perform any one or more of the aspects and/or methodologies of the present disclosure. System 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Memory 608 may include various components (e.g., machine-readable media) including, but not limited to, a random access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

System 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

System 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device (e.g., a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to system 600 via storage device 624 (e.g., a removable disk drive, a flash drive, etc.) and/or network interface device 640. A network interface device, such as network interface device 640, may be utilized for connecting system 600 to one or more of a variety of networks, such as network 644, and one or more remote devices 648 connected thereto.

Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from system 600 via network interface device 640.

System 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

The foregoing has been a detailed description of illustrative embodiments of the disclosure. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this disclosure. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present disclosure. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this disclosure.

Exemplary embodiments have been disclosed above and illustrated in the accompanying drawings. It will be understood by those skilled in the art that various changes, omissions and additions may be made to that which is specifically disclosed herein without departing from the spirit and scope of the present disclosure.

What is claimed is:

1. An aircraft ground power cable management and monitoring system, comprising:
   at least one aircraft ground power cable assembly having a unique cable assembly identifier, an aircraft connection end and a power supply connection end, plural insulated power conductors, at least one voltage sensor associated with each of said plural insulated power conductors disposed adjacent the aircraft connection end to sense output voltage in each said plural insulated power conductor and a communication wire associated with each said voltage sensor and power conductor extending from its associated voltage sensor to the power supply connection end;
   at least one power supply with arc fault protection to which said at least one ground power cable assembly is connectable at said power supply connection end,
   a database configured to store said unique cable assembly identifier associated with date, location and operational information with respect said at least one ground power cable assembly; and
   a processor and at least one memory communicating with said at least one power supply, at least one ground power cable assembly and said database, said memory containing instructions executable on said processor for installation of at least one said aircraft ground power cable assembly and for ground power operation with said aircraft ground power cable assembly installed,
   wherein said installation instructions comprise instructions for prompting for entry of said cable assembly unique identifier and gate number, prompting for confirmation of completion of installation tests performed on said installed aircraft ground power cable assembly, and recording of entered data in said database; and
   wherein said installation instructions comprise instructions for prompting for entry of an aircraft to be powered identifier, monitoring of a number of power cycles applied to said cable assembly, monitoring of power levels applied and voltage drop through said cable assembly and recording entered and monitored data in said database.

2. The system of claim 1, wherein said unique cable assembly identifier comprises a machine readable code affixed with said at least one ground power cable assembly and said at least one power supply further comprises an automated reader for said identifier and wherein said prompting for entry of the unique cable identifier comprises the processor automatically receiving said identifier from said reader.

3. The system of claim 1, wherein said cable assembly installation tests comprise at least one of a load bank test, a plug force test and a phase sequence test.

4. The system of claim 1, further comprising at least one of a load bank tester, a plug force tester and a sequence tester communicating with said processor to record test completion information in said database.

5. The system of claim 1, wherein said instructions stored in memory further comprise instructions to cause the processor to prompt for monthly testing at predetermined time intervals after cable assembly installation.

6. The system of claim 1, wherein said processor and memory are comprised of components of the at least one power supply.

7. The system of claim 1, wherein said processor and memory communicate with the at least one power supply through a network.

8. The system of claim 1, wherein the at least one power supply includes an arc fault protection system comprising:
multiple phase lines corresponding in number to the number of phases of electrical power delivered by the power supply through said ground power cable assembly;
a current divider disposed in each phase line configured to divide input current into a larger current fraction and a smaller current fraction through electrically parallel current paths;
an arc fault protection breaker disposed in each said smaller fraction current path, said arc fault protection breakers having a current capacity less than the input current and greater than the smaller current fraction;
a current sensor in each said smaller fraction current path;
a multi-phase relay switch connected across each said phase line; and
a relay switch actuator communicating with each said voltage sensor, said relay switch actuator configured to actuate the multi-phase relay switch to disconnect each said phase line simultaneously upon receiving a signal from one said voltage sensor indicating a voltage break in one said smaller faction current path.

9. The system of claim 1, wherein the at least one power supply includes an arc fault protection system comprising a circuit breaker and at least one of a current or voltage monitor configured to detect characteristics of the power signal in each phase of the at least one power cable assembly and to trigger the circuit breaker upon detection of signal characteristics indicating an arc fault in said cable assembly.

10. The system of claim 1, wherein said aircraft ground power cable assembly is a three-phase, 400 Hz ground power cable assembly.

11. A method of installing, monitoring and delivering ground power to an aircraft with a ground power cable assembly comprising;
connecting a ground power cable assembly to a power supply communicating with a control processor and database;
recording a unique cable identifier associated with the installed cable assembly in the database;
prompting the user through a user interface communicating with the control processor to enter a gate number for the installed ground power cable assembly and recording the gate number in the database;
prompting the user through the user interface to confirm completion of at least one installation test and recording installation test data in the database;
prompting the user through the graphical user interface to initiate a ground power operation for an aircraft through the installed cable;
prompting the user to enter the aircraft identification number;
recording a number of usage cycles for the installed aircraft ground power cable in the database;
monitoring voltage drop through the ground power cable assembly and power delivered and recording voltage drop and power delivered in the database; and
automatedly prompting the user or terminating ground power delivery when an alert condition is detected by the control processor based on monitored parameters.

12. The method of claim 11, further comprising prompting the user to initiate periodic testing of the installed ground power cable assembly when a number of usage cycles meets or exceeds a preset threshold.

13. A high current, multi-phase arc fault protection system, comprising:
multiple phase lines corresponding in number to the number of phases;
a current divider disposed in each phase line configured to divide input current into a larger current fraction and a smaller current fraction through electrically parallel current paths;
an arc fault protection breaker disposed in each said smaller fraction current path, said arc fault protection breakers having a current capacity less than the input current and greater than the smaller current fraction;
a current sensor in each said smaller fraction current path;
a multi-phase relay switch connected across each said phase line; and
a relay switch actuator communicating with each said voltage sensor, said relay switch actuator configured to actuate the multi-phase relay switch to disconnect each said phase line simultaneously upon receiving a signal from one said voltage sensor indicating a voltage break in one said smaller faction current path.

14. The arc fault protection system of claim 13, wherein said relay switch actuator comprises a processor communicating with the voltage sensors and controlling excitation of a coil trip of the multi-phase relay switch.

15. The arc fault protection system of claim 14, wherein the straight through connector provides approximately 90% of the total cross-section and the arc fault breaker connector provides about 10% of the total cross-section.

16. The arc fault protection system of claim 13, wherein said current dividers comprise first and second connectors of the same conductive material together having total cross section, wherein a straight through connector provides connector cross-section of greater than 50% total connector cross-section and the arc fault breaker connector provides a connector cross-section of less than 50% of the total cross-section of connector material, with the two cross-sections together totalling 100%.

* * * * *

UNITED STATES PATENT AND TRADEMARK OFFICE
CERTIFICATE OF CORRECTION

| | |
|---|---|
| PATENT NO. | : 11,799,280 B1 |
| APPLICATION NO. | : 16/858285 |
| DATED | : October 24, 2023 |
| INVENTOR(S) | : Preston D. Shultz et al. |

It is certified that error appears in the above-identified patent and that said Letters Patent is hereby corrected as shown below:

In the Claims

In Column 14, Line 27, Claim 1, the word "to" should be added before the word "said".

Signed and Sealed this
Twentieth Day of February, 2024

Katherine Kelly Vidal
*Director of the United States Patent and Trademark Office*